US012663443B2

(12) United States Patent
Hozoi et al.

(10) Patent No.: US 12,663,443 B2
(45) Date of Patent: Jun. 23, 2026

(54) CURRENT SENSING DEVICE

(71) Applicant: ABB Schweiz AG, Baden (CH)

(72) Inventors: Adrian Hozoi, Mannheim (DE);
Jaromir Podzemny, Brno (CZ)

(73) Assignee: ABB Schweiz AG, Baden (CH)

( * ) Notice: Subject to any disclaimer, the term of this
patent is extended or adjusted under 35
U.S.C. 154(b) by 126 days.

(21) Appl. No.: 18/621,311

(22) Filed: Mar. 29, 2024

(65) Prior Publication Data

US 2024/0329092 A1 Oct. 3, 2024

(30) Foreign Application Priority Data

Mar. 30, 2023 (EP) ..................................... 23165435

(51) Int. Cl.
G01R 15/18 (2006.01)
G01R 19/00 (2006.01)
H01F 38/30 (2006.01)

(52) U.S. Cl.
CPC ....... G01R 15/181 (2013.01); G01R 19/0092
(2013.01); H01F 38/30 (2013.01)

(58) Field of Classification Search
CPC .... G01R 15/181; G01R 19/0092; H01F 38/30
See application file for complete search history.

(56) References Cited

U.S. PATENT DOCUMENTS 9,453,858 B2 9/2016 Seal et al.
9,494,620 B2 11/2016 Dames et al.

9,664,711 B2 5/2017 Lint et al.
2011/0148561 A1 6/2011 Lint et al.
2014/0333284 A1 11/2014 Dames et al.
2017/0108539 A1* 4/2017 Connell .............. G01R 33/0011
2022/0099706 A1* 3/2022 Bartlett ................ G01R 15/181

FOREIGN PATENT DOCUMENTS

EP 0209415 B1 11/1989

OTHER PUBLICATIONS

European Patent Office, Extended European Search Report in
European Patent Application No. 23165435.1, 9 pp. (Sep. 22, 2023).

* cited by examiner

*Primary Examiner* — Judy Nguyen
*Assistant Examiner* — Adam S Clarke
(74) *Attorney, Agent, or Firm* — Fitch Even Tabin &
Flannery LLP

(57) ABSTRACT

A current sensing device comprises N coil elements,
arranged in annular or polygonal configuration. Coil at i=1
is adjacent coil at i=N, and coil at i=x is adjacent to coils at
i=x−1 and i=x+1. Each coil comprises a plurality of wire
winding layers comprising innermost and outermost wire
winding layers that are electrically connected to each other.
The outermost layer of coil at i=1 is connected to a terminal
via an electrical link. The outermost layer of coil at i=y is
connected to innermost layer of coil at i=y−2 via an elec-
trical link. Outermost layer of coil at i=2 is connected to a
terminal via an electrical link. Outermost layer of coil at i=z
is connected to innermost layer of coil at i=z−2 via an
electrical link. Innermost layer of coil at i=N is connected to
innermost layer of coil at i=N−1 via an electrical link.

12 Claims, 6 Drawing Sheets

CURRENT SENSING DEVICE

CROSS-REFERENCE TO RELATED APPLICATIONS

The instant application claims priority to European Patent Application No. 23165435.1, filed Mar. 30, 2023, which is incorporated herein in its entirety by reference.

FIELD OF THE DISCLOSURE

The present disclosure generally relates to a current sensing device.

BACKGROUND OF THE INVENTION

Current sensing devices comprising one or more coil elements have been receiving increasing interest in the last decades. A coil element comprises a bobbin and a winding segment applied on a winding body of the bobbin which is non-magnetic and non-conductive, where the winding segment is formed from a length of wire wound around a central axis of the winding body. In such a current sensing device with a plurality of coil elements, a common form is the Rogowski coil configuration, where the coil elements are arranged to form an approximately closed path around an opening foreseen for a conductor and are connected electrically to sum their signals and to provide a measurement voltage of the device, which is indicative of the current in the conductor. However, the measurement is also influenced by external magnetic and electric fields and by parasitic couplings.

In common implementations, it is known to connect the coil elements in a successive arrangement and to provide a return conductor to compensate for the electrical loop formed be the path of coil elements as disclosed in EP0209415B1 and U.S. Pat. No. 9,664,711B2. However, at best when it is optimally applied, the return conductor helps only against interferences from uniform magnetic fields.

In U.S. Pat. Nos. 9,494,620B2 and 9,453,858B2, it is disclosed connecting part of the coil elements in a forward path and part of the coil elements in a backward path in an intercalated manner, with the aim to reduce the effect of asymmetry on the accuracy of a measurement. The concept allows reducing influences from interfering uniform electric fields and uniform magnetic fields but is not sufficient to provide strong immunity. Mainly, the concept is relatively weak against non-uniform electric or magnetic fields, which are most common in electrical installations.

BRIEF SUMMARY OF THE INVENTION

The present disclosure generally describes an improved current sensing device. In an aspect, there is provided a current sensing device comprising N coil elements, where N is an even number greater than or equal to 4. The N coil elements are arranged in an annular or polygonal configuration. Each coil element is located at a position number i in the annular or polygonal configuration, where i=1 to N. The coil element at position number i=1 is located adjacent to the coil element at position i=N. The coil element located at position number i=x is located adjacent to the coil element located at position i=x−1. The coil element located at position number i=x is located adjacent to the coil element located at position i=x+1, where 1<x<N.

Each coil element comprises a plurality of wire winding layers comprising an innermost wire winding layer and an outermost wire winding layer, and the wire winding layers are electrically connected to each other. An outermost wire winding layer of the coil element at position number i=1 is connected to a terminal via an electrical link. An outermost wire winding layer of the coil element located at position number i=y is connected to an innermost wire winding layer of the coil element located at position number i=y−2 via an electrical link, where y is an odd number greater than or equal to 3. An outermost wire winding layer of the coil element at position number i=2 is connected to a terminal via an electrical link. An outermost wire winding layer of the coil element located at position number i=z is connected to an innermost wire winding layer of the coil element located at position number i=z−2 via an electrical link, where z is an even number greater than or equal to 4. An innermost wire winding layer of the coil element located at position number i=N is connected to an innermost wire winding layer of the coil element located at position number i=N−1 via an electrical link.

BRIEF DESCRIPTION OF THE SEVERAL VIEWS OF THE DRAWING(S)

DETAILED DESCRIPTION OF THE INVENTION

Figure 1A:
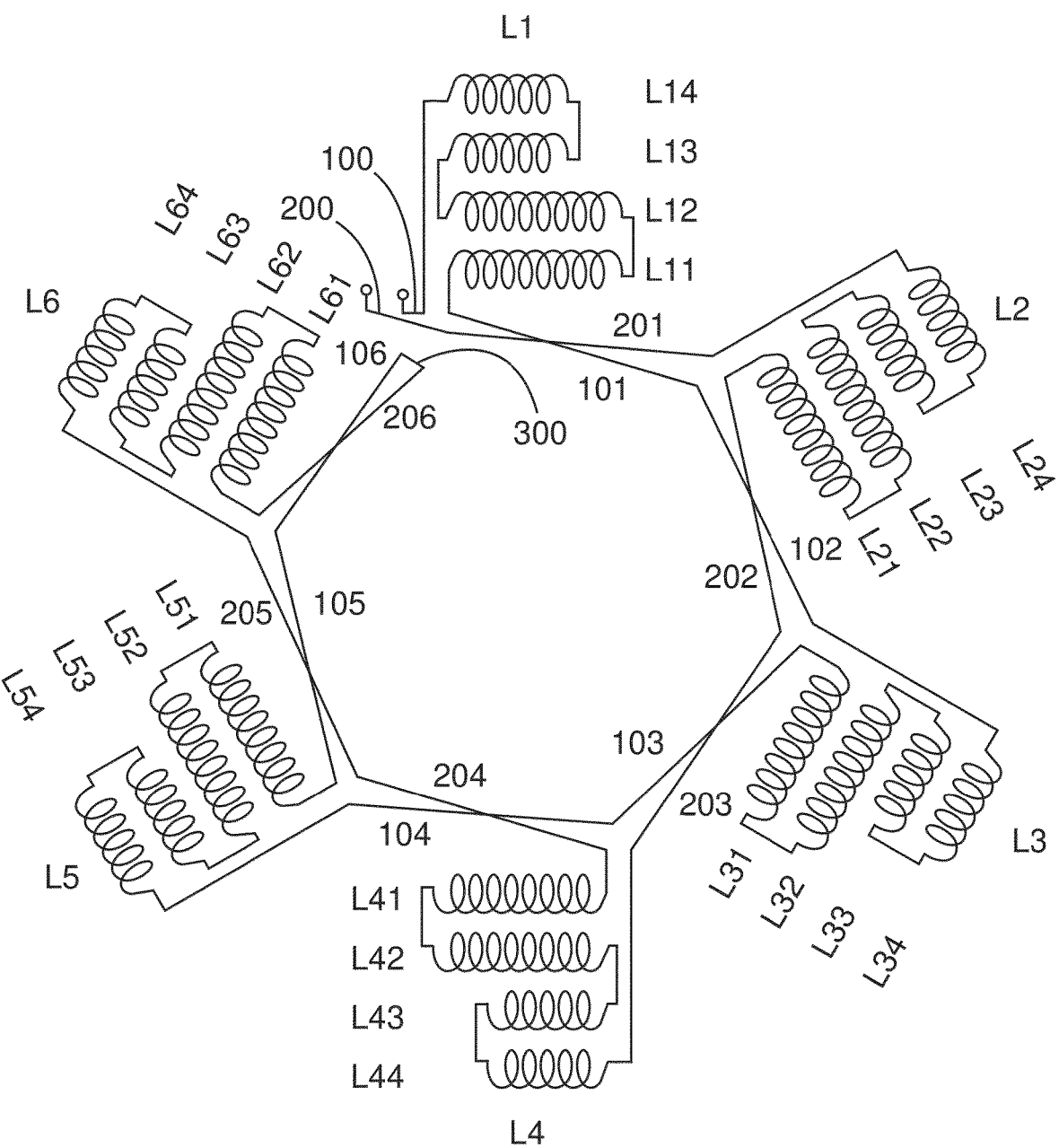
FIG. 1A shows a schematic representation of an exemplar current sensing device with a plurality of exemplar coil elements in accordance with the disclosure.
Figure 1B:
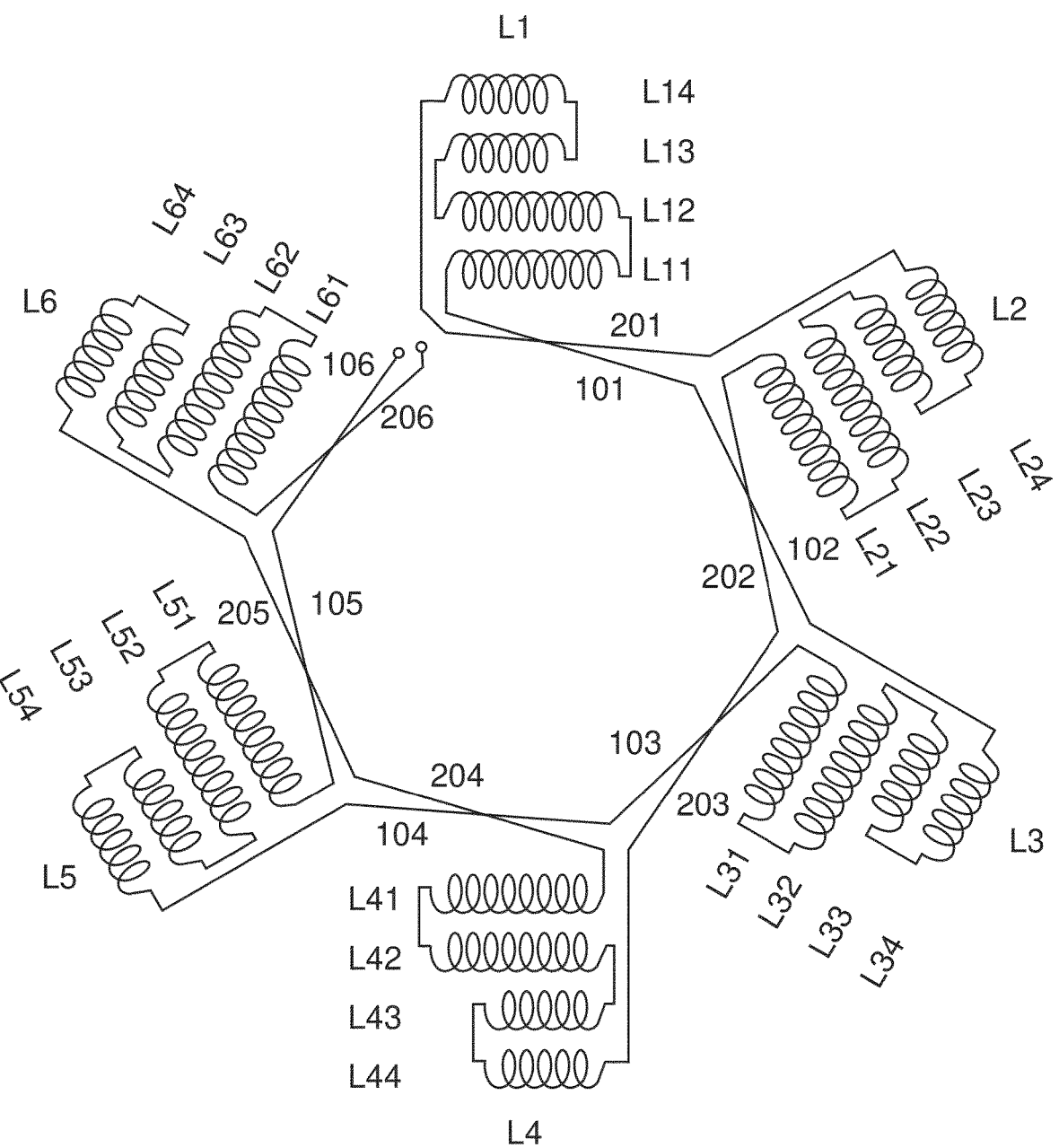
FIG. 1B shows a schematic representation of an exemplar current sensing device with a plurality of exemplar coil elements in accordance with the disclosure.

FIGS. 1A-B, FIGS. 2A-B, and 4-5 relate to new current sensing devices. It is to be noted that FIGS. 1A and 1B show 6 coil elements, but there could be 8, 10, 12, 14, 16, 18, 20, 22, 24, 26, 28, 30, 32 or more even numbers of coil elements and the description below applies to such increased numbers of coil elements.

Also, it is to be noted that FIGS. 1A and 1B show coil elements with 4 winding layers, with two innermost winding layers L11, L12, L21, L22, L31, L32, L41, L42, L51, L52, L61, L62 that are adjacent to a winding body of the coil element and two outermost winding layers L13, L14, L23, L24, L33, L34, L43, L44, L53, L54, L63, L64 that further from the winding body. A width of a winding layer along an axis of the winding body means a width of the windings of wire. Thus, for example a width of winding layer L11 can have a maximum width that is equal to a width of the winding body that the wire is wound around, but can be shorter than this width. Rather than 4 winding layers there can be 2 winding layers. Also, rather than 4 winding layers, with two winding layers having widths shorter than the width of the other two winding layers, there can be 4 winding layers all having the same width. Also, rather than there being 4 winding layers, there can be 6, 8, 10, 12, 14, 16, 18 winding layers etc. In one set of embodiments all but the outermost two winding layers have the same width, and then the outermost two winding layers have the same width, that is shorter than the width of the inner winding layers. In another set of embodiments, there can again be 6, 8, 10, 12, 14, 16, 18 winding layers etc., but where all the winding layers have the same width.

Figure 2A:
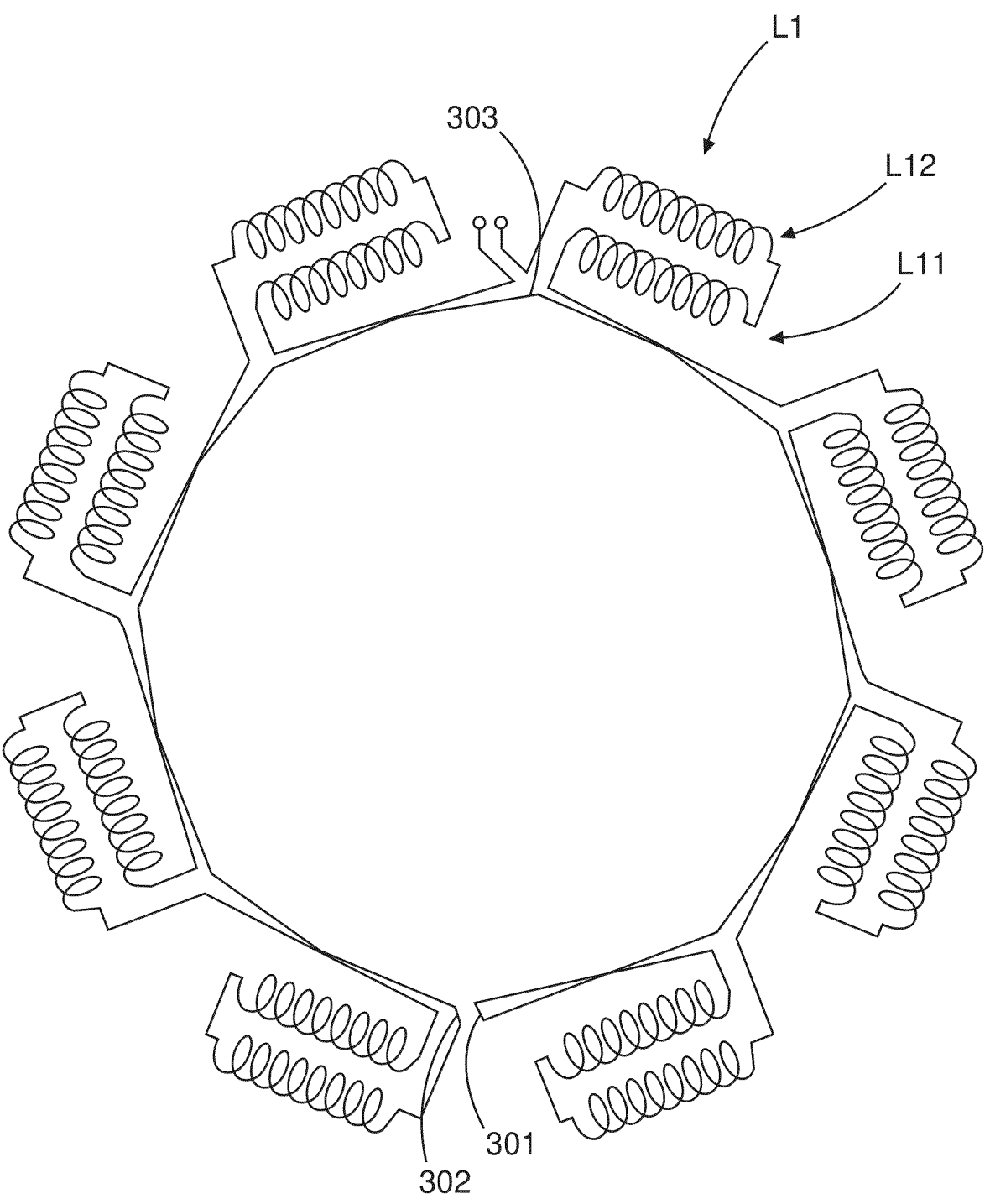
FIG. 2A shows a schematic representation of an exemplar current sensing device with a plurality of exemplar coil elements in accordance with the disclosure.
Figure 2B:
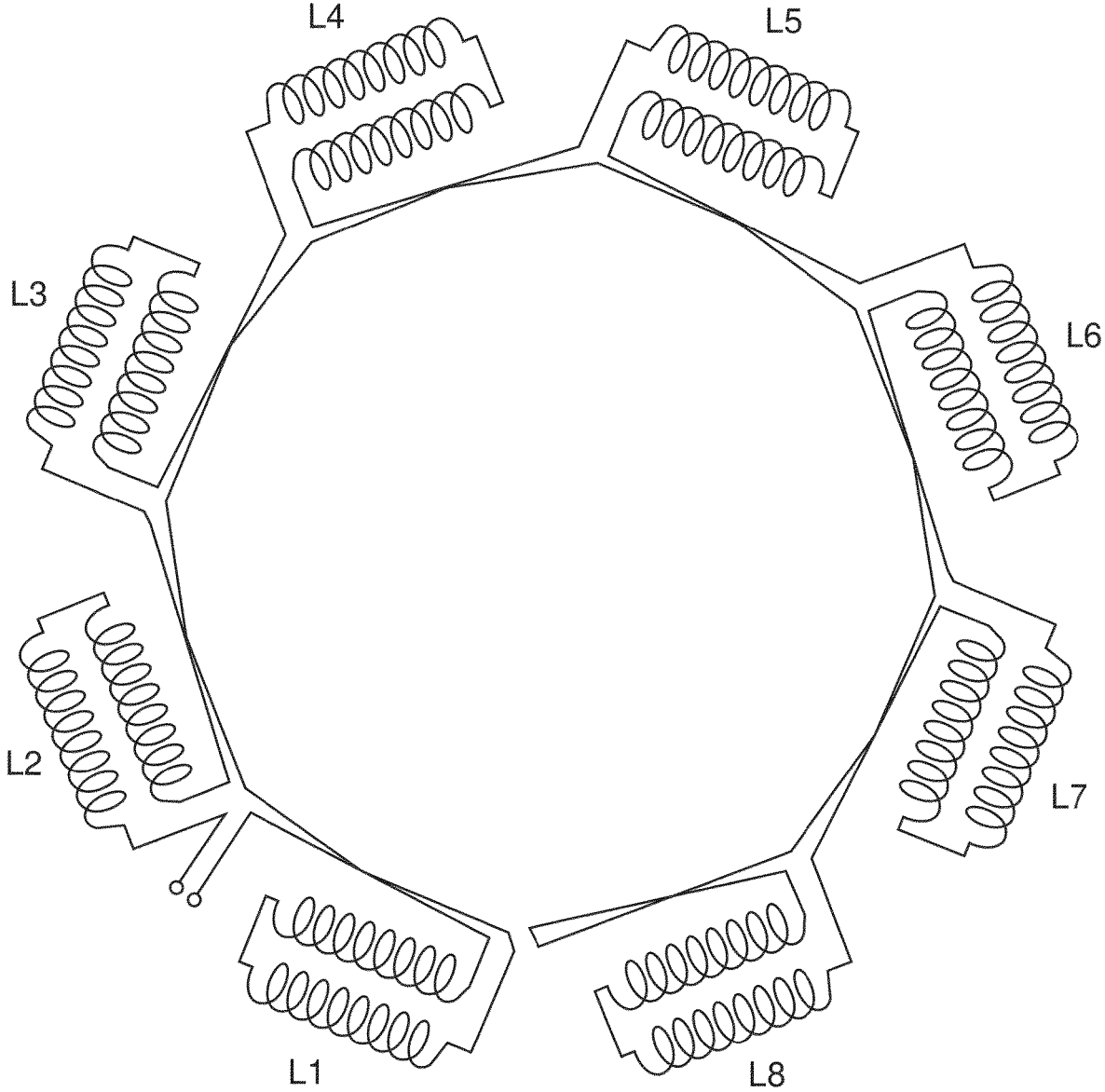
FIG. 2B shows a schematic representation of an exemplar current sensing device with a plurality of exemplar coil elements in accordance with the disclosure.

It is to be noted that FIG. 2A-B show 8 coil elements, but there could be 12, 16, 20, 24, 28 32 etc. and the description below applies to such increased numbers of coil elements. Also, the features described with respect to FIG. 1A-B, where there is an outer pair of winding layers with a width less than an inner pair of winding layers also applies to FIG. 2. And again, there could be 4, 6, 8, 10, 12, 14, 16 etc. winding layers, all of the same width, or 4, 6, 8, 10, 12, 14, 16 etc. with an outer pair of winding layers having a width less than the width of all the other (inner) winding layers that are all of the same width.

In an example, a current sensing device comprises N coil elements $L1$, $L2$, $L3$, $L4$, $L5$, $L6$, where, as discussed above, there can be more than 6 coil elements, and thus the last coil element $L6$ is hereafter termed $LN:L6$ to make it clear that there can be N coil elements. N is an even number greater than or equal to 4. The N coil elements are arranged in an annular or polygonal configuration. Each coil element is located at a position number i in the annular or polygonal configuration, where i=1 to N. The coil element $L1$ at position number i=1 is located adjacent to the coil element $LN:L6$ at position i=N. The coil element located at position number i=x is located adjacent to the coil element located at position i=x−1. The coil element located at position number i=x is located adjacent to the coil element located at position i=x+1, where 1<x<N.

Each coil element comprises a plurality of wire winding layers comprising an innermost wire winding layer $L11$, $L21$, $L31$, $L41$, $L51$, $L61$ and an outermost wire winding layer $L14$, $L24$, $L34$. $L44$. $L54$. $L64$, and wherein the wire winding layers are electrically connected to each other. An outermost wire winding layer $L14$ of the coil element $L1$ at position number i=1 is connected to a terminal via an electrical link $100$. An outermost wire winding layer $L34$, $L54$ of the coil element $L3$, $L5$ located at position number i=y is connected to an innermost wire winding layer $L11$, $L31$ of the coil element $L1$, $L3$ located at position number i=y−2 via an electrical link $101$, $102$, $103$, $104$, where y is an odd number greater than or equal to 3. An example of this connection scheme is shown in FIG. 1, where $L54$ is connected to $L31$ via electrical link $103$, $104$, and $L34$ is connected to $L11$ via electrical link $101$, $102$. An outermost wire winding layer $L24$ of the coil element $L2$ at position number i=2 is connected to a terminal via an electrical link $200$, $201$. An outermost wire winding layer $L44$, $L64$ of the coil element $L4$, $L6$ located at position number i=z is connected to an innermost wire winding layer $L21$, $L41$ of the coil element $L2$, $L4$ located at position number i=z−2 via an electrical link, wherein z is an even number greater than or equal to 4. An example of this connection scheme is shown in FIG. 1A, where $L64$ is connected to $L41$ via electrical link $204$, $205$, and $L44$ is connected to $L21$ via electrical link $202$, $203$. An innermost wire winding layer $L61$ of the coil element $LN:L6$ located at position number i=N is connected to an innermost wire winding layer $L51$ of the coil element $LN−1:L5$ located at position number i=N−1 via an electrical link $105$, $106$, $206$, $300$. Here $LN:L6$ indicates that the sixth coil element $L6$ shown in FIG. 1A could actually be the Nth, and here $L−1:L5$ indicates that the 5th coil element shown in FIG. 1A could actually be the (N−1), i.e. the one adjacent to the Nth coil element.

Here reference to an "annular or polygonal configuration", simply means that the coil elements can in effect be straight and thus, a true annulus is not formed, rather an "annulus" with straight side portions—a polygonal configuration can be formed.

In an example, N=6, or 8, or 10, or 12, or 14, or 16, or 18, or 20, or 22, or 24, or 26, or 28, or 30, or 32 etc. In an example, the wire windings of the wire of the innermost wire winding are adjacent to one another. This is shown for example in FIGS. 4-5. In an example, the wire windings of the wire of the innermost wire winding are all adjacent to one another or substantially all adjacent to one another. This is shown for example in FIGS. 4-5. In an example, the wire windings of the wire of the outermost wire winding are adjacent to one another. This is shown for example in FIGS. 4-5. In an example, the wire windings of the wire of the outermost wire winding are all adjacent to one another or substantially all adjacent to one another. This is shown for example in FIGS. 4-5.

According to an example, for each coil element, wire wound around an axis of a winding body of the coil element forms the innermost wire winding layer and wire wound around the axis of the winding body of the coil element forms the outermost wire winding layer. A width of the innermost wire winding layer along the axis of the winding body is substantially the same as a width of the outermost wire winding layer along the axis of the winding body. Two wire windings, innermost and outermost, of the same width are shown in FIG. 2A-B.

According to an example, the width of the innermost wire winding layer along the axis of the winding body is substantially the same for all the coil elements.

According to an example, for each coil element, wire wound around an axis of a winding body of the coil element forms the innermost wire winding layer and wire wound around the axis of the winding body of the coil element forms the outermost wire winding layer. A width of the innermost wire winding layer along the axis of the winding body is greater than a width of the outermost wire winding layer along the axis of the winding body. Two wire windings, innermost and outermost, of different widths as described here are shown in FIG. 1A, e.g. $L11:L14$, $L21:L24$, $L31:L34$, $L41:L44$, $L51:L54$, $L61:L64$.

According to an example, the width of the innermost wire winding layer along the axis of the winding body is substantially the same for all the coil elements. An example of this is shown in both FIG. 1A and FIG. 2A-B.

According to an example, the width of the outermost wire winding layer along the axis of the winding body is substantially the same for all the coil elements. An example of this is shown in both FIG. 1A and FIG. 2A-B.

According to an example, each coil element comprises a third wire winding layer $L12$, $L22$, $L32$, $L42$, $L52$, $L62$ directly electrically connected to the innermost wire winding layer and located between the innermost wire winding layer and the outermost wire winding layer. Wire wound around the axis of the winding body of the coil element forms the third wire winding layer. The width of the innermost wire winding layer along the axis of the winding body is substantially the same as a width of the third wire winding layer along the axis of the winding body. An example of this is shown in FIG. 1A.

In an example, the wire windings of the wire of the third wire winding layer are adjacent to one another. This is shown for example in FIGS. 4-5. In an example, the wire windings of the wire of the third wire winding layer are all adjacent to one another or substantially all adjacent to one another. This is shown for example in FIGS. 4-5.

According to an example, each coil element comprises a fourth wire winding layer L13, L23, L33, L43, L53, L63 directly electrically connected to the outermost wire winding layer and located between the innermost wire winding layer and the outermost wire winding layer. Wire wound around the axis of the winding body of the coil element forms the fourth wire winding layer. The width of the outermost wire winding layer along the axis of the winding body is substantially the same as a width of the fourth wire winding layer along the axis of the winding body. An example of this is shown in FIG. 1A.

In an example, the wire windings of the wire of the fourth wire winding layer are adjacent to one another. This is shown for example in FIGS. 4-5. In an example, the wire windings of the wire of the fourth wire winding layer are all adjacent to one another or substantially all adjacent to one another. This is shown for example in FIGS. 4-5.

According to an example, a portion 201 of the electrical link that connects the outermost wire winding layer of the coil element L2 at position number i=2 to the terminal crosses a portion 101 of the electrical link that connects the outermost wire winding layer of the coil element L3 at position number i=3 to the innermost wire winding of the coil element L1 at position i=1. An example of this is shown in FIG. 1A.

According to an example, the electrical link that connects the outermost wire winding layer of the coil element L4, L6 located at position number i=z to the innermost wire winding layer of the coil element L2, L4 located at position number i=z−2 crosses at least one electrical link that connects the outermost wire winding layer of the coil element L3, L5 located at position number i=y to the innermost wire winding layer of the coil element L1, L3 located at position number i=y−2. An example of this connection scheme is shown in FIG. 1A where 204 crosses 104, 203 crosses 103, 202 crosses 102, and 201 crosses 101. Thus, crossing conditions are z=y−1 and z=y+1, and there is at least a crossing at z=y−1 and there is at least a crossing at z=y+1.

According to an example, a portion 105 of the electrical link that connects the innermost wire winding layer L61 of the coil element LN:L6 located at position number i=N to the innermost wire winding layer L51 of the coil element L−1:L5 located at position number i=N−1 crosses a portion 205 of the electrical link that connects the outermost wire winding layer L64 of the coil element LN:L6 located at position number i=N to the innermost wire winding layer L41 of the coil element L−2:L4 located at position number i=N−2. An example of this is shown in FIG. 1A.

According to an example, a bridge portion 300 of the electrical link that connects the innermost wire winding layer L61 of the coil element LN:L6 located at position number i=N to the innermost wire winding layer L51 of the coil element L−1:L5 located at position number i=N−1 is substantially shorter than the other portions 105, 106, 206 of the electrical link that connects the innermost wire winding layer L61 of the coil element LN:L6 located at position number i=N to the innermost wire winding layer L51 of the coil element L−1:L5 located at position number i=N−1. An example of this is shown in FIG. 1A.

In an example, a current sensing device comprises N coil elements L1, L2, L3, L4, L5, L6, where, as discussed above, there can be more than 6 coil elements, and thus the last coil element L6 is hereafter termed LN:L6 to make it clear that there can be N coil elements. N is an even number greater than or equal to 4. The N coil elements are arranged in an annular or polygonal configuration. Each coil element is located at a position number i in the annular or polygonal configuration, where i=1 to N. The coil element L1 at position number i=1 is located adjacent to the coil element LN:L6 at position i=N. The coil element located at position number i=x is located adjacent to the coil element located at position i=x−1. The coil element located at position number i=x is located adjacent to the coil element located at position i=x+1, where 1<x<N.

Each coil element comprises a plurality of wire winding layers comprising an innermost wire winding layer L11, L21, L31, L41, L51, L61 and an outermost wire winding layer L14, L24, L34. L44. L54. L64, and wherein the wire winding layers are electrically connected to each other. An outermost wire winding layer L14 of the coil element L1 at position number i=1 is connected to an outermost wire winding layer L24 of the coil element L2 at position number i=2 via an electrical link 201. An outermost wire winding layer L34, L54 of the coil element L3, L5 located at position number i=y is connected to an innermost wire winding layer L11, L31 of the coil element L1, L3 located at position number i=y−2 via an electrical link 101, 102, 103, 104, where y is an odd number greater than or equal to 3. An example of this connection scheme is shown in FIG. 1B, where L54 is connected to L31 via electrical link 103, 104, and L34 is connected to L11 via electrical link 101, 102. An outermost wire winding layer L24 of the coil element L2 at position number i=2 is connected an outermost wire winding layer L14 of the coil element L1 at position number i=1 via an electrical link 201. An outermost wire winding layer L44, L64 of the coil element L4, L6 located at position number i=z is connected to an innermost wire winding layer L21, L41 of the coil element L2, L4 located at position number i=z−2 via an electrical link, wherein z is an even number greater than or equal to 4. An example of this connection scheme is shown in FIG. 1B, where L64 is connected to L41 via electrical link 204, 205, and L44 is connected to L21 via electrical link 202, 203. An innermost wire winding layer L61 of the coil element LN:L6 located at position number i=N is connected to a terminal via an electrical link 206. An innermost wire winding layer L51 of the coil element L−1:L5 located at position number i=N−1 is connected to a terminal via an electrical link 105, 106. Here LN:L6 indicates that the sixth coil element L6 shown in FIG. 1B could actually be the Nth, and here L−1:L5 indicates that the 5th coil element shown in FIG. 1B could actually be the (N−1), i.e. the one adjacent to the Nth coil element.

Here reference to an "annular or polygonal configuration", simply means that the coil elements can in effect be straight and thus, a true annulus is not formed, rather an "annulus" with straight side portions—a polygonal configuration can be formed.

In an example, N=6, or 8, or 10, or 12, or 14, or 16, or 18, or 20, or 22, or 24, or 26, or 28, or 30, or 32 etc. In an example, the wire windings of the wire of the innermost wire winding are adjacent to one another. This is shown for example in FIGS. 4-5. In an example, the wire windings of the wire of the innermost wire winding are all adjacent to one another or substantially all adjacent to one another. This is shown for example in FIGS. 4-5. In an example, the wire windings of the wire of the outermost wire winding are adjacent to one another. This is shown for example in FIGS. 4-5. In an example, the wire windings of the wire of the outermost wire winding are all adjacent to one another or substantially all adjacent to one another. This is shown for example in FIGS. 4-5.

According to an example, for each coil element, wire wound around an axis of a winding body of the coil element forms the innermost wire winding layer and wire wound around the axis of the winding body of the coil element forms the outermost wire winding layer. A width of the innermost wire winding layer along the axis of the winding body is substantially the same as a width of the outermost wire winding layer along the axis of the winding body. Two wire windings, innermost and outermost, of the same width are shown in FIG. 2A-B.

According to an example, the width of the innermost wire winding layer along the axis of the winding body is substantially the same for all the coil elements.

According to an example, for each coil element, wire wound around an axis of a winding body of the coil element forms the innermost wire winding layer and wire wound around the axis of the winding body of the coil element forms the outermost wire winding layer. A width of the innermost wire winding layer along the axis of the winding body is greater than a width of the outermost wire winding layer along the axis of the winding body. Two wire windings, innermost and outermost, of different widths as described here are shown in FIG. 1B, e.g. L11:L14, L21:L24, L31:L34, L41:L44, L51:L54, L61:L64.

According to an example, the width of the innermost wire winding layer along the axis of the winding body is substantially the same for all the coil elements. An example of this is shown in both FIG. 1B and FIG. 2A-B.

According to an example, the width of the outermost wire winding layer along the axis of the winding body is substantially the same for all the coil elements. An example of this is shown in both FIG. 1B and FIG. 2A-B.

According to an example, each coil element comprises a third wire winding layer L12, L22, L32, L42, L52, L62 directly electrically connected to the innermost wire winding layer and located between the innermost wire winding layer and the outermost wire winding layer. Wire wound around the axis of the winding body of the coil element forms the third wire winding layer. The width of the innermost wire winding layer along the axis of the winding body is substantially the same as a width of the third wire winding layer along the axis of the winding body. An example of this is shown in FIG. 1B.

In an example, the wire windings of the wire of the third wire winding layer are adjacent to one another. This is shown for example in FIGS. 4-5. In an example, the wire windings of the wire of the third wire winding layer are all adjacent to one another or substantially all adjacent to one another. This is shown for example in FIGS. 4-5.

According to an example, each coil element comprises a fourth wire winding layer L13, L23, L33, L43, L53, L63 directly electrically connected to the outermost wire winding layer and located between the innermost wire winding layer and the outermost wire winding layer. Wire wound around the axis of the winding body of the coil element forms the fourth wire winding layer. The width of the outermost wire winding layer along the axis of the winding body is substantially the same as a width of the fourth wire winding layer along the axis of the winding body. An example of this is shown in FIG. 1B.

In an example, the wire windings of the wire of the fourth wire winding layer are adjacent to one another. This is shown for example in FIGS. 4-5. In an example, the wire windings of the wire of the fourth wire winding layer are all adjacent to one another or substantially all adjacent to one another. This is shown for example in FIGS. 4-5.

According to an example, a portion 201 of the electrical link that connects the outermost wire winding layer of the coil element L2 at position number i=2 to the outermost wire winding layer of the coil element L1 at position number i=1 crosses a portion 101 of the electrical link that connects the outermost wire winding layer of the coil element L3 at position number i=3 to the innermost wire winding of the coil element L1 at position i=1. An example of this is shown in FIG. 1B.

According to an example, the electrical link that connects the outermost wire winding layer of the coil element L4, L6 located at position number i=z to the innermost wire winding layer of the coil element L2, L4 located at position number i=z−2 crosses at least one electrical link that connects the outermost wire winding layer of the coil element L3, L5 located at position number i=y to the innermost wire winding layer of the coil element L1, L3 located at position number i=y−2. An example of this connection scheme is shown in FIG. 1B where 204 crosses 104, 203 crosses 103, 202 crosses 102, and 201 crosses 101. Thus, crossing conditions are z=y−1 and z=y+1, and there is at least a crossing at z=y−1 and there is at least a crossing at z=y+1.

According to an example, a portion 105 of the electrical link that connects the innermost wire winding layer L51 of the coil element L−1:L5 located at position number i=N−1 to the terminal crosses a portion 205 of the electrical link that connects the outermost wire winding layer L64 of the coil element LN:L6 located at position number i=N to the innermost wire winding layer L41 of the coil element L−2:L4 located at position number i=N−2. An example of this is shown in FIG. 1B.

According to an example, a portion 106 of the electrical link that connects the innermost wire winding layer L51 of the coil element L−1:L5 located at position number i=N−1 to the terminal crosses the electrical link 206, which connects the innermost wire winding layer L61 of the coil element LN:L6 located at position number i=N to the terminal. An example of this is shown in FIG. 1B.

Rather than coil elements forming a full annular or polygonal configuration, with forward direction and backward direction oriented coil elements, a full annular or polygonal configuration can in effect be formed from two half annular or polygonal configurations—half annular or polygonal configuration here relates to the location of the coil elements only where, as made clear below, electrical connections go virtually all the way around the full annular or polygonal configuration. Such configurations are shown in FIGS. 2A-2D. Thus, from a technical perspective, the annular or polygonal configurations from the examples shown FIGS. 1A and 1B and from FIG. 2A-2D are equivalent (except for the number of coil elements). The examples shown in FIGS. 1A-B and from FIG. 2A-D are however particular cases of a device, where in general the terminals of the device can be connected in any electrical link between two coil elements to open the electrical link between the two coil elements.

The following example relates to that shown in FIG. 2A. In this example a current sensing device comprises N1 coil elements, where N1 is a number between 0 and N and wherein N is an integer number; and N2 coil elements, where N2 is a number between 0 and N and wherein N is an integer number. The N1 and N2 coil elements are arranged in an annular or polygonal configuration, and N1+N2 is an even number greater than or equal to 4. The N1 coil elements are arranged in a half annular or polygonal configuration and the N2 coil elements are arranged in a half annular or polygonal configuration.

For the N1 coil elements (when N1>0), each coil element is at located at a position number i in the half annular or polygonal configuration, where i=1 to N1. The coil element located at position number i=x is located adjacent to the coil element located at position i=x−1. The coil element located at position number i=x is located adjacent to the coil element located at position i=x+1, where 1<x<N1.

Each coil element comprises a plurality of wire winding layers comprising an innermost wire winding layer and an outermost wire winding layer, and the wire winding layers are electrically connected to each other. An outermost wire winding layer of the coil element at position number i=1 is connected to a terminal via an electrical link. An outermost wire winding layer of the coil element located at position number i=y is connected to an innermost wire winding layer of the coil element located at position number i=y−2 via an electrical link, where y is an odd number greater than or equal to 3. An outermost wire winding layer of the coil element located at position number i=z is connected to an innermost wire winding layer of the coil element located at position number i=z−2 via an electrical link, where z is an even number greater than or equal to 4. An innermost wire winding layer of the coil element located at position number i=N1 is connected to an innermost wire winding layer of the coil element located at position number i=N1−1 via an electrical link.

For the N2 coil elements (when N2>0), each coil element is at located at a position number i in the half annular or polygonal configuration, where i=1 to N2. The coil element located at position number i=x is located adjacent to the coil element located at position i=x−1. The coil element located at position number i=x is located adjacent to the coil element located at position i=x+1, where 1<x<N2.

Each coil element comprises a plurality of wire winding layers comprising an innermost wire winding layer and an outermost wire winding layer, and where the wire winding layers are electrically connected to each other. An innermost wire winding layer of the coil element at position number i=2 is connected to a terminal via an electrical link. An outermost wire winding layer of the coil element located at position number i=y is connected to an innermost wire winding layer of the coil element located at position number i=y−2 via an electrical link, where y is an odd number greater than or equal to 3. An outermost wire winding layer of the coil element located at position number i=z−2 is connected to an innermost wire winding layer of the coil element located at position number i=z via an electrical link, where z is an even number greater than or equal to 4. An outermost wire winding layer of the coil element located at position number i=N2 is connected to an outermost wire winding layer of the coil element located at position number i=N2−1 via an electrical link.

For the current sensing device, an outermost wire winding layer of the coil element at position number i=2 of the N1 coil elements is connected to an innermost wire winding of the coil element at position number i=1 of the N2 coil elements via an electrical link. The coil element at position number i=1 of the N1 coil elements is located adjacent to the coil element at position number i=1 of the N2 coil elements.

Here reference to a "half annular or polygonal configuration", simply means that the coil elements can in effect be straight and thus, a true half annulus is not formed, rather an "annulus" with straight side portions—a polygonal configuration can be formed. Also, "half" can mean less than a real half, and what is meant is that the two "halves" in effect form a complete annular or polygonal configuration.

In an example, N1+N2 is greater than or equal to 6. Thus, N1 can be an odd number or an even number. N1 can be generally any number between 0 and N. For example, N1 can be 4 as shown in the example of FIG. 2, or N1 can be 0, or N1 can be 6, as shown in the example of FIG. 1. Thus, N2 can be an odd number or an even number. N2 can be generally any number between 0 and N. For example, N2 can be 4 as shown in the example of FIG. 2, or N2 can be 6, or N2 can be 0, as shown in the example of FIG. 1.

Thus, relating to the structure as shown in FIG. 2A, each of the two half annular or polygonal configurations are structured similarly to the arrangement of FIGS. 1A-B, where the two half annular or polygonal configurations are electrically connected. Thus, the annular or polygonal arrangement shown in FIG. 2A is similar to the annular or polygonal arrangement shown in FIGS. 1A-B. An arrangement like in FIGS. 1A-B with any even number of coil elements can also be realized in an arrangement like in FIG. 2A, and vice versa.

In an example, the wire windings of the wire of the innermost wire winding are adjacent to one another. This is shown for example in FIGS. 4-5. In an example, the wire windings of the wire of the innermost wire winding are all adjacent to one another or substantially all adjacent to one another. This is shown for example in FIGS. 4-5. In an example, the wire windings of the wire of the outermost wire winding are adjacent to one another. This is shown for example in FIGS. 4-5. In an example, the wire windings of the wire of the outermost wire winding are all adjacent to one another or substantially all adjacent to one another. This is shown for example in FIGS. 4-5.

According to an example, for each coil element, wire wound around an axis of a winding body of the coil element forms the innermost wire winding layer and wire wound around the axis of the winding body of the coil element forms the outermost wire winding layer. A width of the innermost wire winding layer along the axis of the winding body is substantially the same as a width of the outermost wire winding layer along the axis of the winding body.

In an example, the width of the innermost wire winding layer along the axis of the winding body is substantially the same for all the coil elements.

N1 does not need to equal N2, and N=N1+N2 can be 4, or 6, or 8, or 10, or 12, or 14, or 16, or 18, or 20, or 22, or 24, or 26, or 28, or 30, or 32, or 34, or 36, or 38, or 40 etc.

According to an example, for each coil element, wire wound around an axis of a winding body of the coil element forms the innermost wire winding layer and wire wound around the axis of the winding body of the coil element forms the outermost wire winding layer. A width of the innermost wire winding layer along the axis of the winding body is greater than a width of the outermost wire winding layer along the axis of the winding body. An example of this is shown in FIGS. 1A-B.

In an example, the width of the innermost wire winding layer along the axis of the winding body is substantially the same for all the coil elements. In an example, the width of the outermost wire winding layer along the axis of the winding body is substantially the same for all the coil elements. In an example, each coil element comprises a third wire winding layer directly electrically connected to the innermost wire winding layer and located between the innermost wire winding layer and the outermost wire winding layer. Wire wound around the axis of the winding body of the coil element forms the third wire winding layer, and wherein the width of the innermost wire winding layer along the axis of the winding body is substantially the same as a width of the third wire winding layer along the axis of the winding body. An example of this is shown in FIGS. 1A-B.

In an example, the wire windings of the wire of the third wire winding are adjacent to one another. This is shown for example in FIGS. 4-5. In an example, the wire windings of the wire of the third wire winding are all adjacent to one another or substantially all adjacent to one another. This is shown for example in FIGS. 4-5.

In an example, each coil element comprises a fourth wire winding layer directly electrically connected to the outermost wire winding layer and located between the innermost wire winding layer and the outermost wire winding layer. Wire wound around the axis of the winding body of the coil element forms the fourth wire winding layer, and wherein the width of the outermost wire winding layer along the axis of the winding body is substantially the same as a width of the fourth wire winding layer along the axis of the winding body. An example of this is shown in FIGS. 1A-B.

In an example, the wire windings of the wire of the fourth wire winding are adjacent to one another. This is shown for example in FIGS. 4-5. In an example, the wire windings of the wire of the fourth wire winding are all adjacent to one another or substantially all adjacent to one another. This is shown for example in FIGS. 4-5.

In an example, a portion of the electrical link that connects the outermost wire winding layer of the coil element at position number i=2 of the N1 coil elements to the innermost wire winding of the coil element at position number i=1 of the N2 coil elements crosses a portion of the electrical link that connects the innermost wire winding layer of the coil element at position number i=2 of the N2 coil elements to the terminal. An example of this is shown in FIG. 2A.

In an example, a portion of the electrical link that connects the outermost wire winding layer of the coil element located at position number i=z of the N1 coil elements to the innermost wire winding layer of the coil element located at position number i=z−2 of the N1 coil elements crosses at least one electrical link that connects the outermost wire winding layer of the coil element located at position number i=y of the N1 coil elements to the innermost wire winding layer of the coil element located at position number i=y−2 of the N1 coil elements. An example of this is shown in FIG. 2A.

In an example, a portion of the electrical link that connects the outermost wire winding layer of the coil element located at position number i=z−2 of the N2 coil elements to the innermost wire winding layer of the coil element located at position number i=z of the N2 coil elements crosses at least one electrical link that connects the outermost wire winding layer of the coil element located at position number i=y of the N2 coil elements to the innermost wire winding layer of the coil element located at position number i=y−2 of the N2 coil elements. An example of this is shown in FIG. 2A.

In an example, a bridge portion 301 of the electrical link that connects the innermost wire winding layer of the coil element located at position number i=N1 to the innermost wire winding layer of the coil element located at position number i=N1−1 is substantially shorter than the other portions of the electrical link that connects the innermost wire winding layer of the coil element located at position number i=N1 to the innermost wire winding layer of the coil element located at position number i=N1−1. An example of this is shown in FIG. 2A.

In an example, a bridge portion 302 of the electrical link that connects the outermost wire winding layer of the coil element located at position number i=N2 to the outermost wire winding layer of the coil element located at position number i=N2−1 is substantially shorter than the other portions of the electrical link that connects the outermost wire winding layer of the coil element located at position number i=N2 to the outermost wire winding layer of the coil element located at position number i=N2−1. An example of this is shown in FIG. 2A.

Thus, good accuracy in harsh environments can be achieved by practically eliminating all relevant asymmetries related to the coil elements, to the arrangement of the coil elements, and to the connecting links between the coil elements. Equally important is to eliminate the interference loops occurring for example in the coil elements and in the connecting links between the coil elements.

The new development relates to current sensing devices for sensing an alternating current having high accuracy, strong immunity against magnetic and electric interferences, and low manufacturing cost. The current sensing devices operate according to the Rogowski coil principle and comprise a plurality of coil elements configured in balanced, differential coil pairs. A coil pair comprises a differential electrical link and two coil elements being approximately identical, where a first coil element is connected in a forward path and a second coil element is connected in a backward path.

The coil elements are provided with a balanced and differential configuration of the winding layers, which can be ensured for any practical numbers of turns by arranging the winding layers in pairs. The winding layers of the outermost winding pair are provided with an approximately equal number of turns and an approximately equal length, which is distinctly smaller than the length of the winding body of the bobbin.

Strong immunity against magnetic and electric interferences is ensured by using a fully differential and balanced construction of the device. This is achieved by mainly providing the device with differential cells configured as pairs of approximately identical parts being electrically connected in differential and balanced manner. The concept allows to reduce or eliminate influences from external electric fields and external magnetic fields to provide strong integrity of the measurement voltage of the device. High measurement accuracy is thus ensured even in harsh environments where the device is exposed to strong external fields.

Using differential cells like coil pairs allows a systematic arrangement of the coil elements where a balanced configuration is reliably ensured. A coil pair comprises a first coil sector and a second coil sector being approximately identical, where a coil sector comprises a coil element L1, a forward link portions 101 and a backward link portion 201. The coil element of the first coil sector is connected in a forward path and the coil element of the first coil sector is connected in a backward path. The link portions in a sector are crossed to achieve an improved differential and balanced configuration of the coil sectors in a coil pair. In particular, using coil sectors ensures providing a balancing electrical link (e.g. formed by the link portions 106 and 206 and the bridge link 300) at the end of a last coil pair in a connection loop. A balancing electrical link is necessary to provide an improved differential and balanced configuration of the device. Providing crossed link portions in each coil sector, almost identical link portions in the coil sectors of coil pair, and a balancing electrical link are believed to be inventive. They provide improved balancing at more detailed scale and thus improved immunity of the measurement voltage against interfering magnetic or electric fields having uniform or non-uniform topology.

Using differential cells like winding pairs allows ensuring a balanced and differential configuration of the winding layers for practically any numbers of turns in a coil element. The winding layers in a winding pair have approximately identical longitudinal position and length. Using an approximately identical winding pitch and number of turns in each winding layer of a winding pair ensures an optimally balanced configuration. The length of the winding layers of the outermost winding pair can be smaller than the length of the winding body of the bobbin. This allows achieving a balanced configuration of a coil element for any number of turns while using an optimum winding pitch to ensure the best winding quality. Best winding quality is obtained using an optimum winding pitch in all winding layers of a coil element, where the optimum winding pitch is specific to winding wire type. The optimum winding pitch is typically close to the diameter of the winding wire and a uniform winding pitch in all layers is preferred.

Furthermore, in practice, the winding process is optimized for preferred winding wire types and bobbins for which optimum manufacturing parameters, specifications, and logistics are available. High winding quality, productivity, and low cost can be thus ensured for the preferred winding wire types and bobbins. The number of turns of a coil element depends on the specific application and ratings of the device. It is a great benefit to provide a balanced and differential winding arrangement using any desired number of turns while employing available bobbins and preferred winding wire types with specific optimum winding pitch. The winding quality is thus maximized, and the manufacturing cost is minimized. The high winding quality ensures high basic measurement accuracy and the balanced winding configuration provides high measurement immunity against interfering magnetic or electric fields having uniform or non-uniform topology.

High measurement accuracy is further ensured by the precise position of the coil elements around the conductor carrying the current to be measured. This is achieved by precisely positioning each coil element on a substrate, where each coil element is provided with two locating pins and the substrate is provided with respective retaining holes. The substrate is preferably a PCB (printed circuit board) substrate and the electrical links are provided on the PCB substrate, mainly on a side facing towards the coil elements. The PCB substrate is provided with an electrically shielding plane like a ground plane at least on the side facing away from the coil elements.

Production of linear coil elements and assembly of the coil elements on PCB substrates are suitable for high productivity and low cost, for example by using proven automated techniques. Low cost is achieved by providing a relatively simple PCB substrate with multiple functionalities: mechanical support, accurate positioning, electrical connectivity, electrical shielding, etc.

The positioning accuracy of the coil elements and the stability of the device can be further improved by providing a second substrate to lock the coil elements between the substrates. The second substrate can comprise an electrically conductive material for improved electrical shielding. For example, it can be made from metal material, or form a plastic material containing an electrically conductive filler, or from a composite material. In particular, the second substrate can be a PCB substrate provided with an electrically shielding layer.

The current sensing devices are now described in specific detail relating to several detailed embodiments, where reference is again made to FIGS. 1-2, and FIGS. 4-5.

FIG. 1A-B shows a schematic of a device comprising 2 terminals and 3 coil pairs L1-L2, L3-L4, and L5-L6, where the coil pairs are distributed approximately uniformly around an opening for a conductor. The coil pair L1-L2 comprises 2 coil elements L1, L2 and a differential electrical link comprising 4 link portions 101, 102, 201, 202. The areas enclosed between the link portions 101 and 201 and between 102 and 202 are very small. The link portions 101 and 201, and 102 and 202 are crossed and provide an effective interference loop of the differential electrical link being given by the sum of the vector areas comprised between the link portions, which is negligible. In particular, the effective interference loop is significantly smaller than the area of a wire turn of a coil element. An interference signal induced by an interfering magnetic field in the differential electrical link of the coil pair is thus negligible. The coil elements L1 and L2 are approximately identical and L1 is connected in a forward path and L2 connected in a backward path. This arrangement of L1 and L2 together with the differential electrical link provides the coil pair L1-L2 with a strongly balanced and differential configuration.

The coil pairs L3-L4 and L5-L6 are approximately identical to L1-L2. The coil pair L5-L6 comprises 2 coil elements L5, L6 and 4 electrical link portions 105, 106, 205, 206. The link portions 106 and 206 ending the coil pair L5-L6 are connected by a bridge link 300, which is significantly shorter than the link portions being bridged. The bridge link 300 is located closer to the connection between the coil element L1 and the link portion 101 than to the connection between the coil element L6 and the link portion 206.

The link portion 206 is similar to the link portions 204 and 202, and the link portion 106 is similar to the link portions 104 and 102. The length of the link portion 206 is similar to the length of the coil element L6.

The coil elements L1 to L6 are distributed approximately uniformly to form an approximately closed path around an opening for a conductor. They are electrically connected to sum their signals and to provide at 2 terminals a measurement voltage of the device which is indicative of the current in the conductor. A terminal is electrically connected to L1 by an electrical link 100. L1 is connected to L3 by link portions 101 and 102. L3 is connected to L5 by link portions 103 and 104. L5 is connected to L6 by link portions 105, 106, 300, and 206. L6 is connected to L4 by link portions 205 and 206. L4 is connected to L2 by link portions 203 and 202. The coil elements L1, L3, and L5 are connected in a forward path and the coil elements L6, L4, and L2 are connected in a backward path.

The link portions 101, 102, 103, 104, 105, and 106 form an approximately closed forward link and the link portions 201, 202, 203, 204, 205, and 206 form an approximately closed backward link. The backward link and the forward link is each almost continuous, where the length of an interruption is less than the length of a coil element, preferably less than 50% or 20% shorter than the length of a coil element. The backward link encloses an area which is substantially the same as the area enclosed by the forward link, and the backward link and the forward link cross each other at least once in the vicinity of each coil element or of almost each coil element. This allows to effectively cancel undesired electrical signals induced in the device by external interfering magnetic fields.

The link portions of the forward link together with the coil elements connected by the forward link form a forward arrangement. The link portions of the backward link together with the coil elements connected by the backward link form a backward arrangement. A first terminal 401 is connected via the link portion 100 to the forward arrangement and a second terminal 402 is connected via the link portion 200 to the backward arrangement. The link bridge 300 connects between the forward arrangement and the backward arrangement, in particular between the forward link and the backward link.

In an equivalent example, the terminations of each coil element connecting to the respective link portions can be swapped as compared to the example from FIG. 1A-B.

A differential electrical link may comprise link portions having various shapes and constructions where, for example, the joints between the link portions may be smooth and not clearly noticeable.

The coil element L1 comprises 4 coil sub-elements L11, L12, L13, and L14 which are electrically connected to sum their signals. The coil sub-elements are arranged in sub-element pairs L11-L12 and L13-L14 where each pair mainly has a balanced and differential configuration. A sub-element pair comprises 2 coil sub-elements having approximately identical construction where a first coil element is connected in forward direction and a second coil element is connected in backward direction. The coil sub-elements have wire turns wound in a same direction. L11 and L13 are connected in forward direction and L12 and L14 are connected in backward direction. L11 and L12 have approximately equal length, number of turns, and area of turns, in a sense where minor differences are tolerated. The same applies for L13 and L14. The length and the number of turns of L13 and L14 are smaller than of L11 and L12.

Various arrangements and numbers of coil sub-elements are possible. For example, coil sub-elements can be winding layers of a coil element. Further variations of an equivalent device are possible. In other equivalent implementations, the terminals of the device can be connected to practically any location in the forward link or in the backward link. Thus, as described above the designs of FIGS. 1A and 1B are equivalent, but with slightly different designs. Thus, the design described generally above can have different variations, as discussed below.

The design shown in FIG. 2B, is thus similar to the design shown in FIG. 1A, but with 8 coil elements and not 6, and where the output terminals do not need to be located adjacent to the bridge 300. The design is also similar to that shown in FIG. 2A, and FIG. 1B, where the terminals can be positioned where required with respect to the link that transitions from the forward half to the backward half of the design structure.

Thus, FIG. 2B shows a further exemplar device comprising 8 coil elements configured in 4 coil pairs, and where the terminals of the device are connected approximately in the middle of the forward link. The coil elements and the electrical links between the coil elements of the device are configured in a forward arrangement and in a backward arrangement where the forward arrangement and the backward arrangement are equivalent and antisymmetric. A first terminal is connected via the first link portion to a first half of the forward arrangement and a second terminal is connected via the second link portion to a second half of the forward arrangement. The first link bridge connects between the second half of the forward arrangement and the backward arrangement, in particular between the forward link and the backward link. The second link bridge connects between the backward arrangement and the first half of the forward arrangement, in particular between the backward link and a first coil element L1 of the device. The backward arrangement can comprise a third link bridge connecting between a first half of the backward link to a second half of the backward link.

The exemplar device can be divided into two device portions, where a first device portion is comprised between the second link bridge and the first link portion or the third link bridge, and a second device portion is comprised between the second link portion or the third link bridge and the first link bridge. The first device portion may comprise the first link portion and the first terminal, and the second device portion may comprise the second link portion and the second terminal. The two device portions of the exemplar device can be approximately equal. However, a device can be structured into two portions having any split of coil elements.

A device can be configured into one portion or into two portions, where the terminals of the device can be connected in any electrical link between two coil elements to open the electrical link between the two coil elements. One or both terminals can be provided with link portions connecting to the electrical link between the two coil elements. Or it is possible to locate a terminal in a path of the electrical link between the two coil elements, where a link portion connecting the terminal can be considered to overlap with a link portion of the electrical link between the two coil elements. The distance between the terminals of the device is preferably substantially shorter than the length of a coil element.

A device can be provided with two or more than two device portions, for example to provide a modular structure of the device. One or more fixed or flexible link bridges 303 can be provided between the device portions.

One or more link bridges can be masked, for example by having the length of a link bridge reduced to a minimum or by having a link bridge like a part of an adjacent link portion.

A device comprises an even number of coil elements of at least 4 coil elements, preferably at least 6 coil elements. A coil element can comprise 2, 4, 6, 8, or more than 8 coil sub-elements.

Figures 3, 4:
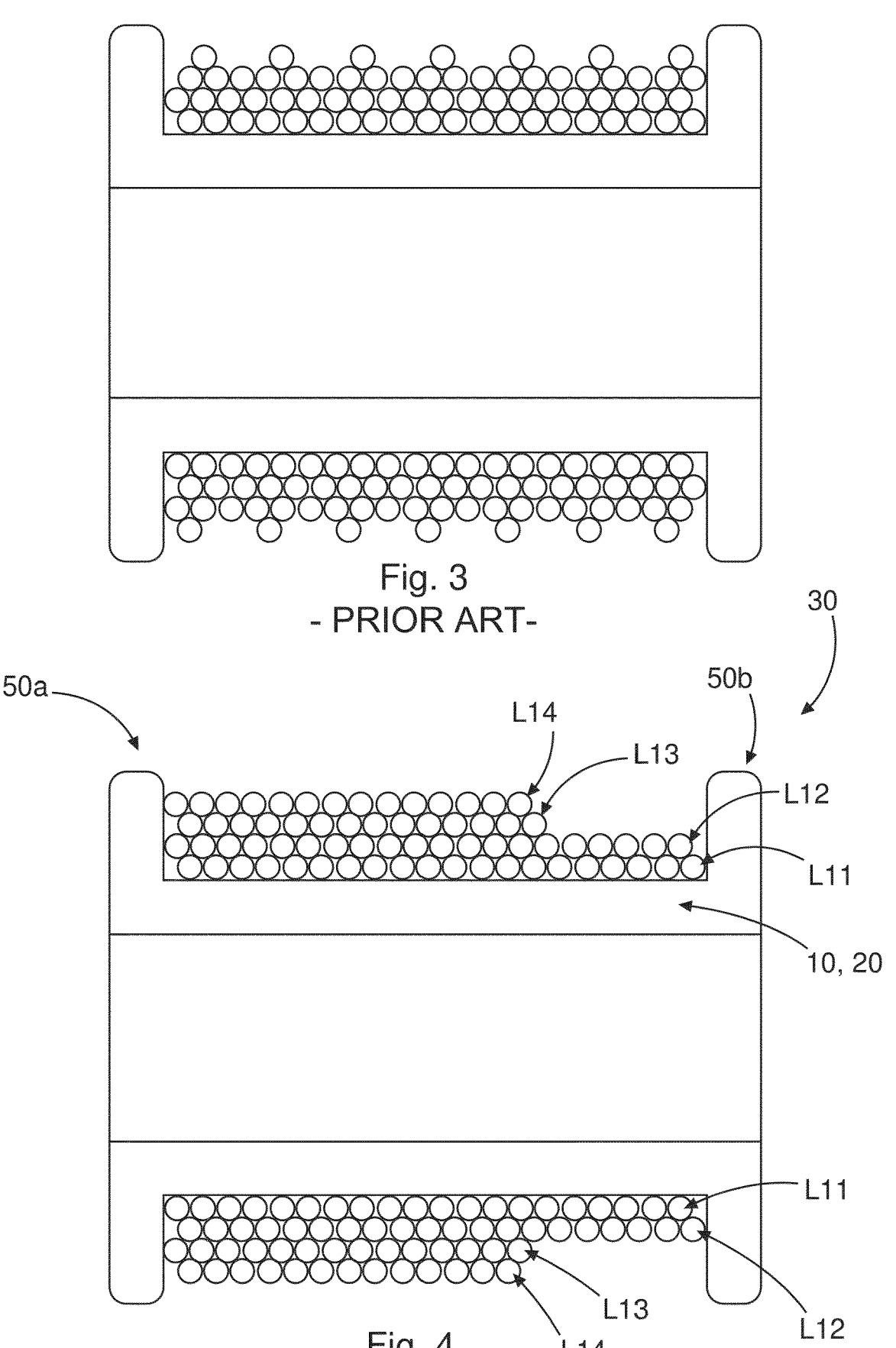
FIG. 3 shows a known coil element.
FIG. 4 shows an example of a new coil element in accordance with the disclosure.

Before discussing the wire winding layers of the new coil elements, an existing coil element is shown in FIG. 3. FIG. 3 shows a schematic cross-section of a coil element of an existing coil element. The coil element comprises 4 winding layers, where the 4th winding layer comprises a number of turns which is distinctly smaller than in any other layer, and the wire turns are not adjacent to one another, but spaced apart and there is only one wire layer with a reduced number of wire turns. In effect, a number of complete wire layers has been intended to be fabricated, but the last layer has only several turns of wire.

Figure 5:
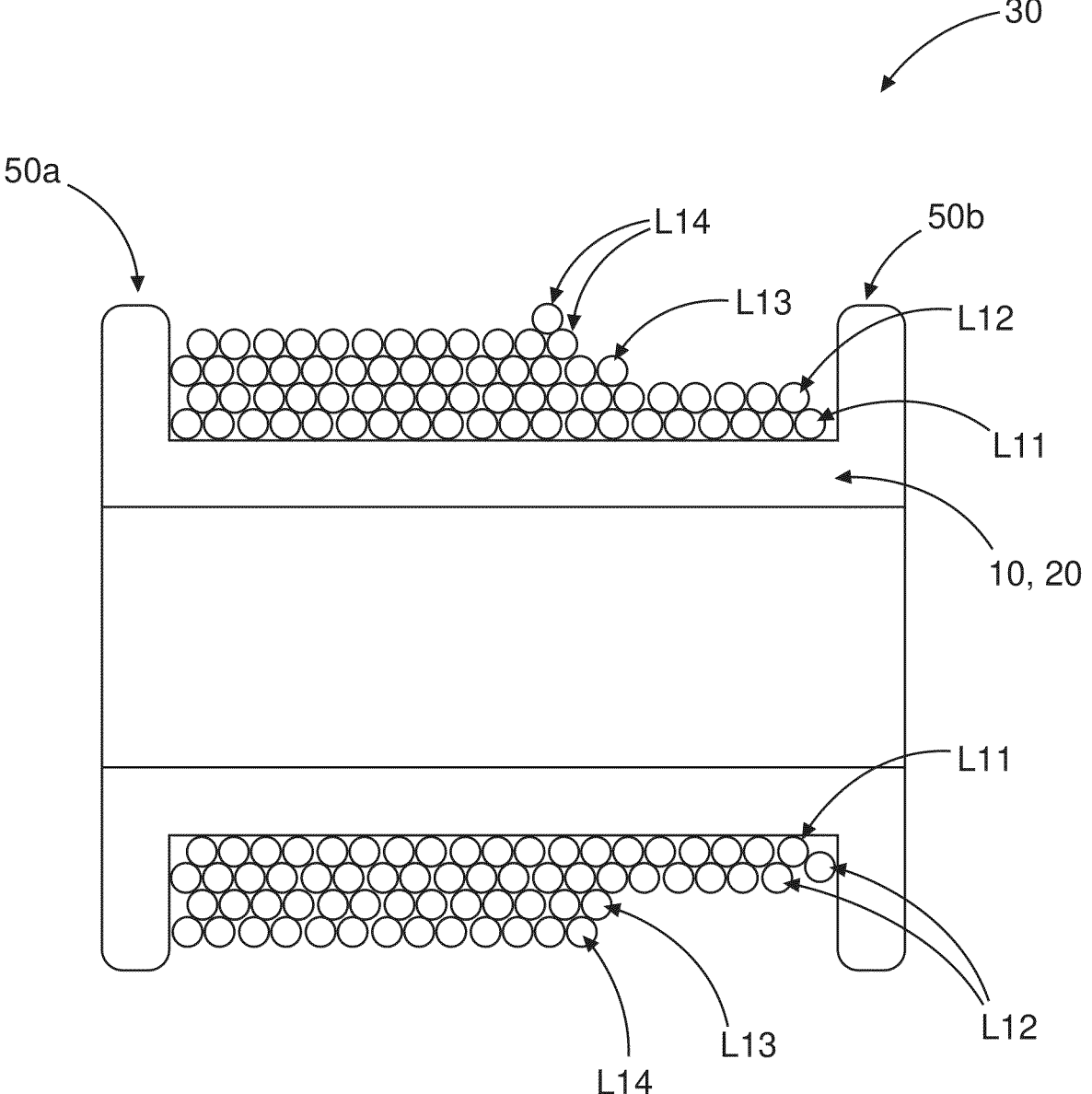
FIG. 5 shows an example of a new coil element in accordance with the disclosure.

This contrasts with the new coil elements as shown in FIGS. 4-5. FIG. 4 shows a schematic cross-section of a new coil element, where the total number of turns is equivalent to the example from FIG. 3. The new coil element of FIG. 4 comprises 4 winding layers which are arranged in 2 winding pairs, where each winding pair comprises 2 winding layers configured in a mainly balanced and differential arrangement. The 1st and 2nd winding layers comprise an approximately equal number of turns and have an approximately equal length, which is almost equal to the length of the winding body of the bobbin. The diameter of the winding wire is significantly smaller than the diameter or the width of the winding body—it is longer in an axial direction that a diameter. The area of a turn (i.e. enclosed by a turn) in the 2nd winding layer is marginally larger than in the 1st winding layer, typically by less than 5% or 3%. The 1st and 2nd winding layers form thus a balanced winding pair. The 3rd and 4th winding layers are also configured to form a balanced winding pair, where the number of turns and the length of the 3rd and 4th winding layers is smaller than of the 1st and 2nd winding layers. The winding pitch between turns in all winding layers is approximately equal, although some variations are possible because of production imperfections.

FIG. 5 shows a variation of coil element with a balanced configuration, which features several winding imperfections. The coil element is similar to the one from the example in FIG. 4 and it features several winding imperfections. The turns of the coil element from FIG. 5 are not perfectly aligned, which can be representative of practical coil elements produced with a focus on low manufacturing cost. The coil element is still understood as featuring a balanced configuration. As can be seen in FIG. 5 the wire turns in the outermost wire winding layer are almost all adjacent to one another, except that a small number (one in this case) is not immediately adjacent to the others. Thus the wire turns are substantially adjacent one to the other. As can be seen in FIG. 5 the wire turns in the second innermost wire winding layer (termed as a third winding layer above) are almost all adjacent to one another, except that a small number (one in this case) is not immediately adjacent to the others. Thus, the wire turns are substantially adjacent one to the other. The same can apply to the innermost wire winding and to the wire winding adjacent to the outermost wire winding layer.

A coil element may have a plurality of balanced and differential winding pairs, where all winding pairs except the outermost winding pair have an approximately equal number of turns and a length approximately equal to the length of the winding body, and where the outermost winding pair has a smaller number of turns and a length which is distinctly smaller than the length of the winding body. It is also possible to have a coil element comprising only one winding pair, where the winding layers have a length which is distinctly smaller than the length of the winding body. Thus, new current sensing devices, of a Rogowski type, comprising coil elements and electrical links configured in a forward arrangement and in a backward arrangement have been developed.

In a detailed embodiment the coil elements from the forward arrangement are intercalated with the coil elements from the backward arrangement. A coil element has an even number of winding layers which is greater than or equal to 2, where the outermost winding layer and the outermost-but-one winding layer have substantially equal number of wire turns and length. The length of the outermost winding layer is shorter than a length of the winding body of the coil element. The length of the outermost winding layer is shorter than a length of an innermost winding layer, and the length of the outermost winding layer is shorter than a length of an innermost-plus-one winding layer, where the innermost winding layer and the innermost-plus-one winding layer have substantially equal number of wire turns and length. A forward link structure of the forward arrangement is almost continuous, and a backward link structure of the backward arrangement is almost continuous, and the backward link encloses an area which is substantially the same as the area enclosed by the forward link.

The winding arrangement disclosed allows producing balanced and differential coil elements with any practical numbers of turns using a given bobbin, while ensuring consistent winding quality. That is, a given bobbin can be reused in multiple applications allowing for low manufacturing cost and low development effort.

An incomplete outermost winding layer like known with respect to existing coil elements, and shown in FIG. 3, causes an unbalanced structure of the coil element, causing for example magnetic interference loops which are not counterbalanced in other winding layer(s). Furthermore, winding with a different pitch than in other layers or making wire jumps to reach the end of the winding body causes low winding quality and poor reproducibility.

The new current sensing device as described here provides a strongly balanced and differential configuration with very good immunity against interfering magnetic or electric fields having uniform or non-uniform topology. The development is comprehensive and implementable using manufacturing processes having high productivity and low cost such as linear coil winding and PCB assembly.

In an example, for each coil element, wire wound around an axis of a winding body of the coil element forms the innermost wire winding layer and wire wound around the axis of the winding body of the coil element forms the outermost wire winding layer. A width of the innermost wire winding layer along the axis of the winding body is substantially the same as a width of the outermost wire winding layer along the axis of the winding body. In an example, the width of the innermost wire winding layer along the axis of the winding body is substantially the same for all the coil elements. In an example, for each coil element, wire wound around an axis of a winding body of the coil element forms the innermost wire winding layer and wire wound around the axis of the winding body of the coil element forms the outermost wire winding layer. A width of the innermost wire winding layer along the axis of the winding body is greater than a width of the outermost wire winding layer along the axis of the winding body.

In an example, the width of the innermost wire winding layer along the axis of the winding body is substantially the same for all the coil elements. In an example, the width of the outermost wire winding layer along the axis of the winding body is substantially the same for all the coil elements.

In an example, each coil element comprises a third wire winding layer directly electrically connected to the innermost wire winding layer and located between the innermost wire winding layer and the outermost wire winding layer. Wire wound around the axis of the winding body of the coil element forms the third wire winding layer. The width of the innermost wire winding layer along the axis of the winding body is substantially the same as a width of the third wire winding layer along the axis of the winding body.

In an example, each coil element comprises a fourth wire winding layer directly electrically connected to the outermost wire winding layer and located between the innermost wire winding layer and the outermost wire winding layer. Wire wound around the axis of the winding body of the coil element forms the fourth wire winding layer. The width of the outermost wire winding layer along the axis of the winding body is substantially the same as a width of the fourth wire winding layer along the axis of the winding body.

In an example, a portion of the electrical link that connects the outermost wire winding layer of the coil element at position number $i=2$ to the terminal crosses a portion of the electrical link that connects the outermost wire winding layer of the coil element at position number $i=3$ to the innermost wire winding of the coil element at position $i=1$.

In an example, the electrical link that connects the outermost wire winding layer of the coil element located at position number i=z to the innermost wire winding layer of the coil element located at position number i=z−2 crosses at least one electrical link that connects the outermost wire winding layer of the coil element located at position number i=y to the innermost wire winding layer of the coil element located at position number i=y−2.

In an example, a portion of the electrical link that connects the innermost wire winding layer of the coil element located at position number i=N to the innermost wire winding layer of the coil element located at position number i=N−1 crosses a portion of the electrical link that connects the outermost wire winding layer of the coil element located at position number i=N to the innermost wire winding layer of the coil element (L−2:L4) located at position number i=N−2.

In an example, a bridge portion of the electrical link that connects the innermost wire winding layer of the coil element located at position number i=N to the innermost wire winding layer of the coil element located at position number i=N−1 is substantially shorter than the other portions of the electrical link that connects the innermost wire winding layer of the coil element located at position number i=N to the innermost wire winding layer of the coil element located at position number i=N−1.

In an aspect, there is provided a current sensing device comprising N coil elements, wherein N is an even number greater than or equal to 4; and wherein, the N coil elements are arranged in an annular or polygonal configuration; wherein each coil element is located at a position number i in the annular or polygonal configuration, where i=1 to N, wherein the coil element at position number i=1 is located adjacent to the coil element at position i=N, and wherein the coil element located at position number i=x is located adjacent to the coil element located at position i=x−1 and the coil element located at position number i=x is located adjacent to the coil element located at position i=x+1, where 1<x<N; wherein each coil element comprises a plurality of wire winding layers comprising an innermost wire winding layer and an outermost wire winding layer, and wherein the wire winding layers are electrically connected to each other; wherein an outermost wire winding layer of the coil element at position number i=1 is connected to an outermost wire winding layer of the coil element at position number i=2 via an electrical link; wherein an outermost wire winding layer of the coil element located at position number i=y is connected to an innermost wire winding layer of the coil element located at position number i=y−2 via an electrical link, where y is an odd number greater than or equal to 3; wherein an outermost wire winding layer of the coil element at position number i=2 is connected an outermost wire winding layer of the coil element (L1) at position number i=1 via an electrical link; wherein an outermost wire winding layer of the coil element located at position number i=z is connected to an innermost wire winding layer of the coil element located at position number i=z−2 via an electrical link, wherein z is an even number greater than or equal to 4; wherein an innermost wire winding layer of the coil element located at position number i=N is connected to a terminal via an electrical link; and wherein an innermost wire winding layer of the coil element located at position number i=N−1 is connected to a terminal via an electrical link.

In an aspect, there is provided a current sensing device comprising N1 coil elements, where N1 is a number between 0 and N and wherein N is an integer number; and N2 coil elements, where N2 is a number between 0 and N and wherein N is an integer. The N1 and N2 coil elements are arranged in an annular or polygonal configuration, and N1+N2 is an even number greater than or equal to 4. The N1 coil elements are arranged in a half annular or polygonal configuration and the N2 coil elements are arranged in a half annular or polygonal configuration.

For the N1 coil elements (when N1>0), each coil element is at located at a position number i in the half annular or polygonal configuration, where i=1 to N1. The coil element located at position number i=x is located adjacent to the coil element located at position i=x−1. The coil element located at position number i=x is located adjacent to the coil element located at position i=x+1, where 1<x<N1.

Each coil element comprises a plurality of wire winding layers comprising an innermost wire winding layer and an outermost wire winding layer, and the wire winding layers are electrically connected to each other. An outermost wire winding layer of the coil element at position number i=1 is connected to a terminal via an electrical link. An outermost wire winding layer of the coil element located at position number i=y is connected to an innermost wire winding layer of the coil element located at position number i=y−2 via an electrical link, where y is an odd number greater than or equal to 3. An outermost wire winding layer of the coil element located at position number i=z is connected to an innermost wire winding layer of the coil element located at position number i=z−2 via an electrical link, where z is an even number greater than or equal to 4. An innermost wire winding layer of the coil element located at position number i=N1 is connected to an innermost wire winding layer of the coil element located at position number i=N1−1 via an electrical link.

For the N2 coil elements (when N2>0), each coil element is at located at a position number i in the half annular or polygonal configuration, where i=1 to N2. The coil element located at position number i=x is located adjacent to the coil element located at position i=x−1. The coil element located at position number i=x is located adjacent to the coil element located at position i=x+1, where 1<x<N2.

Each coil element comprises a plurality of wire winding layers comprising an innermost wire winding layer and an outermost wire winding layer, and where the wire winding layers are electrically connected to each other. An innermost wire winding layer of the coil element at position number i=2 is connected to a terminal via an electrical link. An outermost wire winding layer of the coil element located at position number i=y is connected to an innermost wire winding layer of the coil element located at position number i=y−2 via an electrical link, where y is an odd number greater than or equal to 3. An outermost wire winding layer of the coil element located at position number i=z−2 is connected to an innermost wire winding layer of the coil element located at position number i=z via an electrical link, where z is an even number greater than or equal to 4. An outermost wire winding layer of the coil element located at position number i=N2 is connected to an outermost wire winding layer of the coil element located at position number i=N2−1 via an electrical link.

For the current sensing device, an outermost wire winding layer of the coil element at position number i=2 of the N1 coil elements is connected to an innermost wire winding of the coil element at position number i=1 of the N2 coil elements via an electrical link. The coil element at position number i=1 of the N1 coil elements is located adjacent to the coil element at position number i=1 of the N2 coil elements.

In an example, for each coil element, wire wound around an axis of a winding body of the coil element forms the innermost wire winding layer and wire wound around the axis of the winding body of the coil element forms the outermost wire winding layer. A width of the innermost wire winding layer along the axis of the winding body is greater than a width of the outermost wire winding layer along the axis of the winding body.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A current sensing device, comprising:

N coil elements, wherein N is an even number greater than or equal to 4; and wherein the N coil elements are arranged in an annular or polygonal configuration;

wherein each coil element is located at a position number i in the annular or polygonal configuration, wherein $i=1$ to N, wherein a coil element at position number $i=1$ is located adjacent to the coil element at position $i=N$, and wherein the coil element located at position number $i=x$ is located adjacent to the coil element located at position $i=x-1$ and the coil element located at position number $i=x$ is located adjacent to the coil element located at position $i=x+1$, wherein $1<x<N$;

wherein each coil element comprises a plurality of wire winding layers comprising an innermost wire winding layer and an outermost wire winding layer, and wherein the wire winding layers are electrically connected to each other;

wherein an outermost wire winding layer of the coil element at position number $i=1$ is connected to a terminal via an electrical link;

wherein an outermost wire winding layer of a coil element located at position number $i=y$ is connected to an innermost wire winding layer of the coil element located at position number $i=y-2$ via an electrical link, wherein y is an odd number greater than or equal to 3;

wherein an outermost wire winding layer of a coil element at position number $i=2$ is connected to a terminal via an electrical link;

wherein an outermost wire winding layer of a coil element located at position number $i=z$ is connected to an innermost wire winding layer of the coil element located at position number $i=z-2$ via an electrical link, wherein z is an even number greater than or equal to 4;

wherein an innermost wire winding layer of a coil element located at position number $i=N$ is connected to an innermost wire winding layer of a coil element located at position number $i=N-1$ via an electrical link;

wherein a portion of the electrical link that connects the outermost wire winding layer of the coil element at position number $i=2$ to the terminal crosses a portion of the electrical link that connects the outermost wire winding layer of the coil element at position number $i=3$ to the innermost wire winding of the coil element at position $i=1$;

wherein the electrical link that connects the outermost wire winding layer of the coil element located at position number $i=z$ to the innermost wire winding layer of the coil element located at position number $i=z-2$ crosses at least one electrical link that connects the outermost wire winding layer of the coil element located at position number $i=y$ to the innermost wire winding layer of the coil element located at position number $i=y-2$;

wherein a portion of the electrical link that connects the innermost wire winding layer of the coil element located at position number $i=N$ to the innermost wire winding layer of the coil element located at position number $i=N-1$ crosses a portion of the electrical link that connects the outermost wire winding layer of the coil element located at position number $i=N$ to the innermost wire winding layer of the coil element located at position number $i=N-2$; and wherein a bridge portion of the electrical link that connects the innermost wire winding layer of the coil element located at position number $i=N$ to the innermost wire winding layer of the coil element located at position number $i=N-1$ is substantially shorter than the other portions of the electrical link that connects the innermost wire winding layer of the coil element located at position number $i=N$ to the innermost wire winding layer of the coil element located at position number $i=N-1$.

2. The current sensing device according to claim 1, wherein for each coil element, wire wound around an axis of a winding body of the coil element forms the innermost wire winding layer and wire wound around the axis of the winding body of the coil element forms the outermost wire winding layer, and wherein a width of the innermost wire winding layer along the axis of the winding body is substantially the same as a width of the outermost wire winding layer along the axis of the winding body.

3. The current sensing device according to claim 2, wherein the width of the innermost wire winding layer along the axis of the winding body is substantially the same for all the coil elements.

4. The current sensing device according to claim 1, wherein for each coil element, wire wound around an axis of a winding body of the coil element forms the innermost wire winding layer and wire wound around the axis of the winding body of the coil element forms the outermost wire winding layer, and wherein a width of the innermost wire winding layer along the axis of the winding body is greater than a width of the outermost wire winding layer along the axis of the winding body.

5. The current sensing device according to claim 4, wherein the width of the innermost wire winding layer along the axis of the winding body is substantially the same for all the coil elements.

6. The current sensing device according to claim 4, wherein the width of the outermost wire winding layer along the axis of the winding body is substantially the same for all the coil elements.

7. The current sensing device according to claim 4, wherein each coil element comprises a third wire winding layer directly electrically connected to the innermost wire winding layer and located between the innermost wire winding layer and the outermost wire winding layer, wherein wire wound around the axis of the winding body of the coil element forms the third wire winding layer, and wherein the width of the innermost wire winding layer along the axis of the winding body is substantially the same as a width of the third wire winding layer along the axis of the winding body.

8. The current sensing device according to claim 7, wherein each coil element comprises a fourth wire winding layer directly electrically connected to the outermost wire winding layer and located between the innermost wire winding layer and the outermost wire winding layer, wherein wire wound around the axis of the winding body of the coil element forms the fourth wire winding layer, and wherein the width of the outermost wire winding layer along the axis of the winding body is substantially the same as a width of the fourth wire winding layer along the axis of the winding body.

9. A current sensing device comprising:

N coil elements, wherein N is an even number greater than or equal to 4; and wherein the N coil elements are arranged in an annular or polygonal configuration;

wherein each coil element is located at a position number i in the annular or polygonal configuration, where i=1 to N, wherein a coil element at position number i=1 is located adjacent to a coil element at position i=N, and wherein a coil element located at position number i=x is located adjacent to a coil element located at position i=x−1 and the coil element located at position number i=x is located adjacent to a coil element located at position i=x+1, where 1<x<N;

wherein each coil element comprises a plurality of wire winding layers comprising an innermost wire winding layer and an outermost wire winding layer, and wherein the wire winding layers are electrically connected to each other;

wherein an outermost wire winding layer of the coil element at position number i=1 is connected to an outermost wire winding layer of a coil element at position number i=2 via an electrical link;

wherein an outermost wire winding layer of a coil element located at position number i=y is connected to an innermost wire winding layer of a coil element located at position number i=y−2 via an electrical link, where y is an odd number greater than or equal to 3;

wherein an outermost wire winding layer of the coil element at position number i=2 is connected an outermost wire winding layer of the coil element at position number i=1 via an electrical link;

wherein an outermost wire winding layer of a coil element located at position number i=z is connected to an innermost wire winding layer of a coil element located at position number i=z−2 via an electrical link, wherein z is an even number greater than or equal to 4;

wherein an innermost wire winding layer of the coil element located at position number i=N is connected to a terminal via an electrical link; and wherein an innermost wire winding layer of a coil element located at position number i=N−1 is connected to a terminal via an electrical link;

wherein a portion of the electrical link that connects the outermost wire winding layer of the coil element at position number i=2 to the outermost wire winding layer of the coil element at position number i=1 crosses a portion of the electrical link that connects the outermost wire winding layer of the coil element at position number i=3 to the innermost wire winding of the coil element at position i=1;

wherein the electrical link that connects the outermost wire winding layer of the coil element located at position number i=z to the innermost wire winding layer of the coil element located at position number i=z−2 crosses at least one electrical link that connects the outermost wire winding layer of the coil element located at position number i=y to the innermost wire winding layer of the coil element located at position number i=y−2;

wherein a portion of the electrical link that connects the innermost wire winding layer of the coil element located at position number i=N−1 to the terminal crosses a portion of the electrical link that connects the outermost wire winding layer of the coil element located at position number i=N to the innermost wire winding layer of the coil element located at position number i=N−2; and wherein a portion of the electrical link that connects the innermost wire winding layer of the coil element located at position number i=N−1 to the terminal crosses the electrical link that connects the innermost wire winding layer of the coil element located at position number i=N to the terminal.

10. A current sensing device comprising:

N1 coil elements, where N1 is an integer between 0 and N;

N2 coil elements, where N2 is an integer between 0 and N;

wherein the N1 and N2 coil elements are arranged in an annular or polygonal configuration, wherein N1+N2 is an even number greater than or equal to 4, and wherein the N1 coil elements are arranged in a half annular or polygonal configuration and the N2 coil elements are arranged in a half annular or polygonal configuration;

wherein, for the N1 coil elements, when N1>0:

each coil element is at located at a position number i in the half annular or polygonal configuration, wherein i=1 to N1, wherein a coil element located at position number i=x is located adjacent to a coil element located at position i=x−1 and the coil element located at position number i=x is located adjacent to a coil element located at position i=x+1, wherein 1<x<N1;

each coil element comprises a plurality of wire winding layers comprising an innermost wire winding layer and an outermost wire winding layer, and wherein the wire winding layers are electrically connected to each other;

an outermost wire winding layer of a coil element at position number i=1 is connected to a terminal via an electrical link;

an outermost wire winding layer of a coil element located at position number i=y is connected to an innermost wire winding layer of a coil element located at position number i=y−2 via an electrical link, wherein y is an odd number greater than or equal to 3;

an outermost wire winding layer of a coil element located at position number i=z is connected to an innermost wire winding layer of a coil element located at position number i=z−2 via an electrical link, wherein z is an even number greater than or equal to 4; and wherein an innermost wire winding layer of a coil element located at position number i=N1 is connected to an innermost wire winding layer of a coil element located at position number i=N1−1 via an electrical link;

wherein, for the N2 coil elements, when N2>0:

each coil element is at located at a position number i in the half annular or polygonal configuration, wherein i=1 to N2, wherein a coil element located at position number i=x is located adjacent to a coil element located at position i=x−1 and the coil element located at position number i=x is located adjacent to a coil element located at position i=x+1, wherein 1<x<N2;

each coil element comprises a plurality of wire winding layers comprising an innermost wire winding layer and an outermost wire winding layer, and wherein the wire winding layers are electrically connected to each other;

an innermost wire winding layer of a coil element at position number i=2 is connected to a terminal via an electrical link;

an outermost wire winding layer of a coil element located at position number i=y is connected to an innermost wire winding layer of a coil element located at position number i=y−2 via an electrical link, wherein y is an odd number greater than or equal to 3;

an outermost wire winding layer of a coil element located at position number i=z−2 is connected to an innermost wire winding layer of a coil element located at position number i=z via an electrical link, wherein z is an even number greater than or equal to 4; and an outermost wire winding layer of a coil element located at position number i=N2 is connected to an outermost wire winding layer of a coil element located at position number i=N2−1 via an electrical link; and wherein for the current sensing device:

an outermost wire winding layer of the coil element at position number i=2 of the N1 coil elements is connected to an innermost wire winding of the coil element at position number i=1 of the N2 coil elements via an electrical link; and the coil element at position number i=1 of the N1 coil elements is located adjacent to the coil element at position number i=1 of the N2 coil elements; wherein a portion of the electrical link that connects the outermost wire winding layer of the coil element at position number i=2 of the N1 coil elements to the innermost wire winding of the coil element at position number i=1 of the N2 coil elements crosses a portion of the electrical link that connects the innermost wire winding layer of the coil element at position number i=2 of the N2 coil elements to the terminal;

wherein a portion of the electrical link that connects the outermost wire winding layer of the coil element located at position number i=z of the N1 coil elements to the innermost wire winding layer of the coil element located at position number i=z−2 of the N1 coil elements crosses at least one electrical link that connects the outermost wire winding layer of the coil element located at position number i=y of the N1 coil elements to the innermost wire winding layer of the coil element located at position number i=y−2 of the N1 coil elements;

wherein a portion of the electrical link that connects the outermost wire winding layer of the coil element located at position number i=z−2 of the N2 coil elements to the innermost wire winding layer of the coil element located at position number i=z of the N2 coil elements crosses at least one electrical link that connects the outermost wire winding layer of the coil element located at position number i=y of the N2 coil elements to the innermost wire winding layer of the coil element located at position number i=y−2 of the N2 coil elements;

wherein a bridge portion of the electrical link that connects the innermost wire winding layer of the coil element located at position number i=N1 to the innermost wire winding layer of the coil element located at position number i=N1−1 is substantially shorter than the other portions of the electrical link that connects the innermost wire winding layer of the coil element located at position number i=N1 to the innermost wire winding layer of the coil element located at position number i=N1−1; and wherein a bridge portion of the electrical link that connects the outermost wire winding layer of the coil element located at position number i=N2 to the outermost wire winding layer of the coil element located at position number i=N2−1 is substantially shorter than the other portions of the electrical link that connects the outermost wire winding layer of the coil element located at position number i=N2 to the outermost wire winding layer of the coil element located at position number i=N2−1.

11. The current sensing device according to claim 10, wherein for each coil element, wire wound around an axis of a winding body of the coil element forms the innermost wire winding layer and wire wound around the axis of the winding body of the coil element forms the outermost wire winding layer, and wherein a width of the innermost wire winding layer along the axis of the winding body is substantially the same as a width of the outermost wire winding layer along the axis of the winding body.

12. The current sensing device according to claim 10, wherein for each coil element, wire wound around an axis of a winding body of the coil element forms the innermost wire 5 winding layer and wire wound around the axis of the winding body of the coil element forms the outermost wire winding layer, and wherein a width of the innermost wire winding layer along the axis of the winding body is greater than a width of the outermost wire winding layer along the 10 axis of the winding body.

\* \* \* \* \*